US010748853B2

(12) United States Patent
Kim et al.

(10) Patent No.: US 10,748,853 B2
(45) Date of Patent: Aug. 18, 2020

(54) FLEXIBLE DISPLAY DEVICE (71) Applicant: Samsung Display Co., Ltd., Yongin-si, Gyeonggi-do (KR)

(72) Inventors: Jonghwan Kim, Yongin-si (KR); Sangurn Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/383,084

(22) Filed: Apr. 12, 2019

(65) Prior Publication Data
US 2019/0244904 A1 Aug. 8, 2019

Related U.S. Application Data (63) Continuation of application No. 15/403,083, filed on Jan. 10, 2017, now Pat. No. 10,304,776.

(30) Foreign Application Priority Data

Jan. 11, 2016 (KR) .................. 10-2016-0003296

(51) Int. Cl.
H01L 23/538 (2006.01)
H01L 27/32 (2006.01)
H01L 51/00 (2006.01)
H01L 51/52 (2006.01)

(52) U.S. Cl.
CPC ...... *H01L 23/5385* (2013.01); *H01L 27/3276* (2013.01); *H01L 51/0097* (2013.01); *H01L 51/5256* (2013.01); *H01L 2251/5338* (2013.01); *Y02E 10/549* (2013.01)

(58) Field of Classification Search
CPC ............ H01L 51/0097; H01L 23/5385; H01L 27/3276; H01L 2251/5338; H01L 51/5256; H01L 27/3244
USPC ..... 257/40, 59, 72; 438/48, 82, 99, 128, 148
See application file for complete search history.

(56) References Cited

U.S. PATENT DOCUMENTS

| 7,633,761 | B2 | 12/2009 | Kim |
| 8,027,009 | B2 | 9/2011 | Baek et al. |
| 2003/0048256 | A1 | 3/2003 | Salmon |
| 2007/0134473 | A1 | 6/2007 | Kim |
| 2011/0298811 | A1 | 12/2011 | Al-Dahle et al. |

(Continued)

FOREIGN PATENT DOCUMENTS

| KR | 10-2005-0001917 A | 1/2005 |
| KR | 10-2007-0007636 A | 1/2007 |

(Continued)

*Primary Examiner* — Thinh T Nguyen
(74) *Attorney, Agent, or Firm* — Lewis Roca Rothgerber Christie LLP (57) ABSTRACT A flexible display device is disclosed. In one aspect, the display device includes a flexible display panel including a display substrate, wherein the display substrate includes an active area for pixel circuits, an inactive area adjacent to the active area and having a pad area including a plurality of pad terminals, and a thin film encapsulation layer covering the active area. The display device also includes a display driver electrically connected to the pad terminals and a plurality of driving terminals each having a rounding unit. A conductive unit is configured to electrically connect the pad terminals to the respective driving terminals.

19 Claims, 11 Drawing Sheets (56) References Cited

U.S. PATENT DOCUMENTS

2012/0107978 A1* 5/2012 Shin et al. .......... H01L 51/5253
                                                        438/29
2012/0320542 A1  12/2012  Jeong et al.
2014/0049449 A1   2/2014  Park et al.
2015/0076531 A1   3/2015  Kim
2015/0382446 A1  12/2015  Kwon et al.

FOREIGN PATENT DOCUMENTS

KR    10-2009-0123522 A    12/2009
KR    10-2010-0075215 A     7/2010
KR    10-2012-0133390 A    12/2012

* cited by examiner

FLEXIBLE DISPLAY DEVICE

CROSS-REFERENCE TO RELATED APPLICATION

This application is a continuation of U.S. patent application Ser. No. 15/403,083, filed Jan. 10, 2017, which claims priority to and the benefit of Korean Patent Application No. 10-2016-0003296, filed on Jan. 11, 2016, in the Korean Intellectual Property Office, the disclosure of each of which is incorporated herein in its entirety by reference.

BACKGROUND

Field

The described technology generally relates to a flexible display device.

Description of the Related Technology

In general, display devices are used in mobile devices such as smartphones, laptop computers, digital cameras, camcorders, mobile information terminals, and tablet personal computers (PCs), and electronic devices such as desktop computers, TVs, outdoor billboards, and display devices for exhibition use.

Recently, display devices having thin profiles have been developed to meet market demand, particularly in the mobile device product segment.

Flexible display devices may be conveniently carried and applied to devices with various non-planar shapes. One example of a flexible display device uses organic light-emitting diode (OLED) display technology. In such flexible display devices, a pad terminal may be electrically connected to a driving terminal of a driver circuits. This circuit supplies data and control signals to the active matrix of pixels that emits light to form composite images.

SUMMARY OF CERTAIN INVENTIVE ASPECTS

One inventive aspect relates to a flexible display device including a pad terminal and a driving terminal stably connected to each other.

Another aspect is a flexible display device that includes a flexible display panel including a display substrate, the display substrate including an active area, an inactive area extending outside the active area and having a pad area where a plurality of pad terminals are arranged, and a thin film encapsulation layer covering the active area; a driver electrically connected to the pad terminals and including a plurality of driving terminals having a rounding unit; and a conductive unit provided between the pad terminals and the driving terminals and configured to electrically connect corresponding pad terminals to driving terminals.

According to an embodiment, the driver includes a flexible film; and driving terminals at an edge of the flexible film. The rounding unit rounds an edge of each of the driving terminals.

According to an embodiment, the driving terminals and the pad terminals perpendicularly face each other with the conductive unit in between.

According to an embodiment, the edge of each of the driving terminals corresponds to an edge of a surface of each of the driving terminals facing the pad terminals.

According to an embodiment, the pad terminals are arranged in at least two columns on the display substrate, and the driving terminals are arranged in at least two columns on the flexible display film.

According to an embodiment, the pad terminals include a plurality of first pad terminals on a first column and a plurality of second pad terminals on a second column adjacent to the plurality of first pad terminals. The driving terminals include a plurality of first driving terminals corresponding to the first pad terminals and a plurality of second driving terminals corresponding to the second pad terminals.

According to an embodiment, at least one barrier is provided between a plurality of first driving terminals on a first column and a plurality of second first driving terminals on a second column.

According to an embodiment, the at least one barrier protrudes from a surface of the flexible film which faces the pad terminals.

According to an embodiment, a height of the barrier corresponds to a distance between the display substrate and the flexible film.

According to an embodiment, the at least one barrier is provided in a dot pattern between each of the first driving terminals and each of the second driving terminals.

According to an embodiment, the at least one barrier is provided as at least one strip between a group of the first driving terminals and a group of the second driving terminals.

According to an embodiment, the at least one barrier extends in the form of a single strip between the first driving terminals and the second driving terminals.

According to an embodiment, the at least one barrier includes an insulating material.

According to an embodiment, the first pad terminals and the second pad terminals are alternately arranged, and the first driving terminals and the second driving terminals correspond to the first pad terminals and the second pad terminals, respectively.

According to an embodiment, the driver includes a chip on film.

According to an embodiment, the conductive unit is an anisotropic conductive film.

According to an embodiment, the conductive unit includes conductive particles functioning as an electric path of the pad terminals and the driving terminals; and an insulating resin burying the conductive particles.

According to an embodiment, a back plate is provided under the display substrate.

According to an embodiment, each of the pad terminals is rounded.

According to an embodiment, the flexible display panel includes an organic light-emitting display panel including at least one thin film transistor (TFT) provided above the display substrate and including a semiconductor active layer, a gate electrode, a source electrode, and a drain electrode; and an organic light-emitting device (OLED) electrically connected to the TFT.

Another aspect is a flexible display device comprising: a flexible display panel including a display substrate, wherein the display substrate includes an active area for pixel circuits, an inactive area adjacent to the active area and having a pad area including a plurality of pad terminals, and a thin film encapsulation layer covering the active area; a display driver electrically connected to the pad terminals and comprising a plurality of driving terminals each having a rounding unit; and a conductive unit configured to electrically connect the pad terminals to the respective driving terminals.

In the above flexible display device, the display driver comprises a flexible film, wherein at least one of the driving terminals is located at an edge of the flexible film, and wherein the rounding unit includes a round edge of each of the driving terminals.

In the above flexible display device, the driving terminals and the pad terminals respectively face one another with the conductive unit provided therebetween.

In the above flexible display device, each of the driving terminals has an edge that corresponds to an edge of the respective pad terminal.

In the above flexible display device, the pad terminals are arranged in at least two columns over the display substrate, wherein the driving terminals are arranged in at least two columns over the flexible film.

In the above flexible display device, the pad terminals comprise a plurality of first pad terminals on a first column and a plurality of second pad terminals on a second column adjacent to the first pad terminals, and wherein the driving terminals comprise a plurality of first driving terminals overlapping the first pad terminals and a plurality of second driving terminals overlapping the second pad terminals in the depth dimension of the flexible display device.

The above flexible display device further comprises at least one barrier provided between a plurality of first ones of the driving terminals on a first column and a plurality of second ones of the driving terminals on a second column.

In the above flexible display device, the at least one barrier protrudes from a surface of the flexible film facing the pad terminals.

In the above flexible display device, the barrier has a height that is the same as the distance between the display substrate and the flexible film.

In the above flexible display device, the at least one barrier includes a dot pattern between the first driving terminals and the second driving terminals.

In the above flexible display device, the at least one barrier includes at least one strip between a group of the first driving terminals and a group of the second driving terminals.

In the above flexible display device, the at least one barrier extends in the form of a single strip between the first and second driving terminals.

In the above flexible display device, the at least one barrier s formed of an insulating material.

In the above flexible display device, the first pad terminals and the second pad terminals are alternately arranged, wherein the first and second driving terminals respectively overlaps the first pad terminals and the second pad terminals in the depth dimension of the flexible display device.

In the above flexible display device, the display driver comprises a chip on film.

In the above flexible display device, the conductive unit includes an anisotropic conductive film.

In the above flexible display device, the conductive unit comprises: a plurality of conductive particles configured to form an electric path between the pad terminals and the driving terminals; and an insulating resin surrounding the conductive particles.

The above flexible display device further comprises a back plate provided under the display substrate.

In the above flexible display device, each of the pad terminals has at least one rounded edge.

In the above flexible display device, the flexible display panel comprises an organic light-emitting diode (OLED) display panel comprising: at least one thin film transistor (TFT) provided above the display substrate and comprising a semiconductor active layer, a gate electrode, a source electrode, and a drain electrode; and an OLED electrically connected to the TFT.

Another aspect is a flexible display device comprising: a display substrate having a pad area, wherein the pad area includes a plurality of pad terminals; and a display driver comprising a plurality of driving terminals, wherein the driving terminals are respectively connected to the pad terminals via a plurality of conductive particles. The flexible display device of claim 21, further comprising a conductive unit interposed between the driving terminals and the pad terminals and configured to electrically connect the pad terminals to the respective driving terminals, wherein the conductive unit comprises: the conductive particles configured to form an electric path between the pad terminals and the driving terminals; and an insulating resin surrounding the conductive particles.

The above flexible display device further comprises a at least one barrier formed between adjacent driving terminal columns.

In the above flexible display device, the pad terminals overlap the driving terminals in the depth dimension of the flexible display device, wherein the at least one barrier is formed between adjacent pad terminal columns.

DETAILED DESCRIPTION OF CERTAIN INVENTIVE EMBODIMENTS

As embodiments allows for various changes and numerous embodiments, exemplary embodiments will be illustrated in the drawings and described in detail in the written description. However, this is not intended to limit embodiments to particular modes of practice, and it is to be appreciated that all changes, equivalents, and substitutes that do not depart from the spirit and technical scope of the described technology are encompassed in embodiments. In the description of embodiments certain detailed explanations of the related art are omitted when it is deemed that they may unnecessarily obscure the essence of the described technology. Expressions such as "at least one of," when preceding a list of elements, modify the entire list of elements and do not modify the individual elements of the list.

The terms used in the present specification are merely used to describe exemplary embodiments, and are not intended to limit embodiments An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, embodiments will be described in detail by explaining exemplary embodiments with reference to the accompanying drawings. Like reference numerals in the drawings denote like elements, and thus description thereof will not be repeated. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
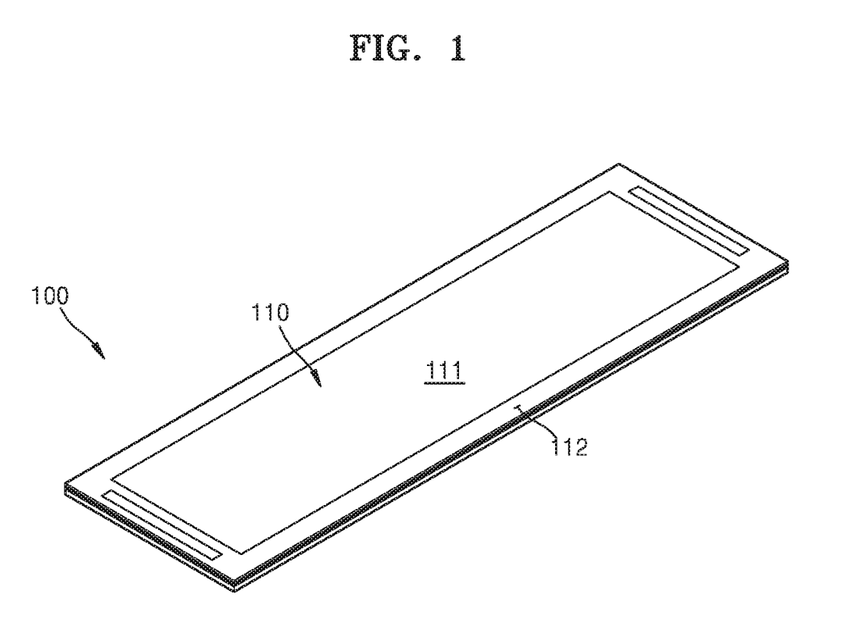
FIG. 1 is a perspective view of a flexible display device in a spread-out state, according to an embodiment.
Figure 2:
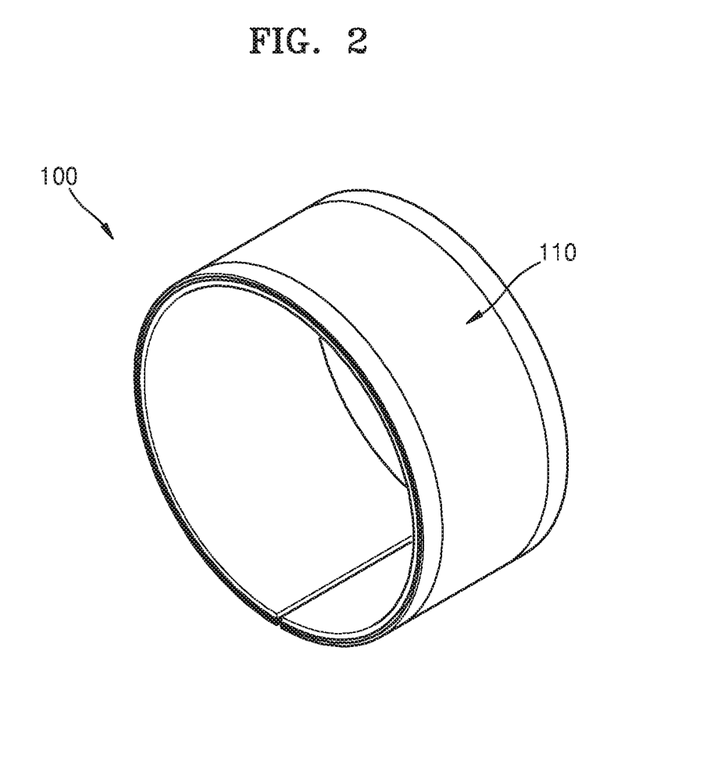
FIG. 2 is a perspective view of the flexible display device of FIG. 1 in a rolled-up state.

FIG. 1 is a perspective view of a flexible display device 100 in a spread-out state according to an embodiment. FIG. 2 is a perspective view of the flexible display device 100 of FIG. 1 in a rolled-up state.

Referring to FIGS. 1 and 2, the flexible display device 100 includes a flexible display panel 110. The flexible display panel 110 may include an active area (AA) 111 displaying images and an inactive area (IAA) 112 extending outside the active area 111.

The flexible display panel 110 may include not only a flexible display substrate, but also various functional films such as a touch screen, a polarizing plate, and a cover window.

The flexible display device 100 may display images in a spread-out state, a curved state, a folded state, or a rolled-up state.

Figure 3:
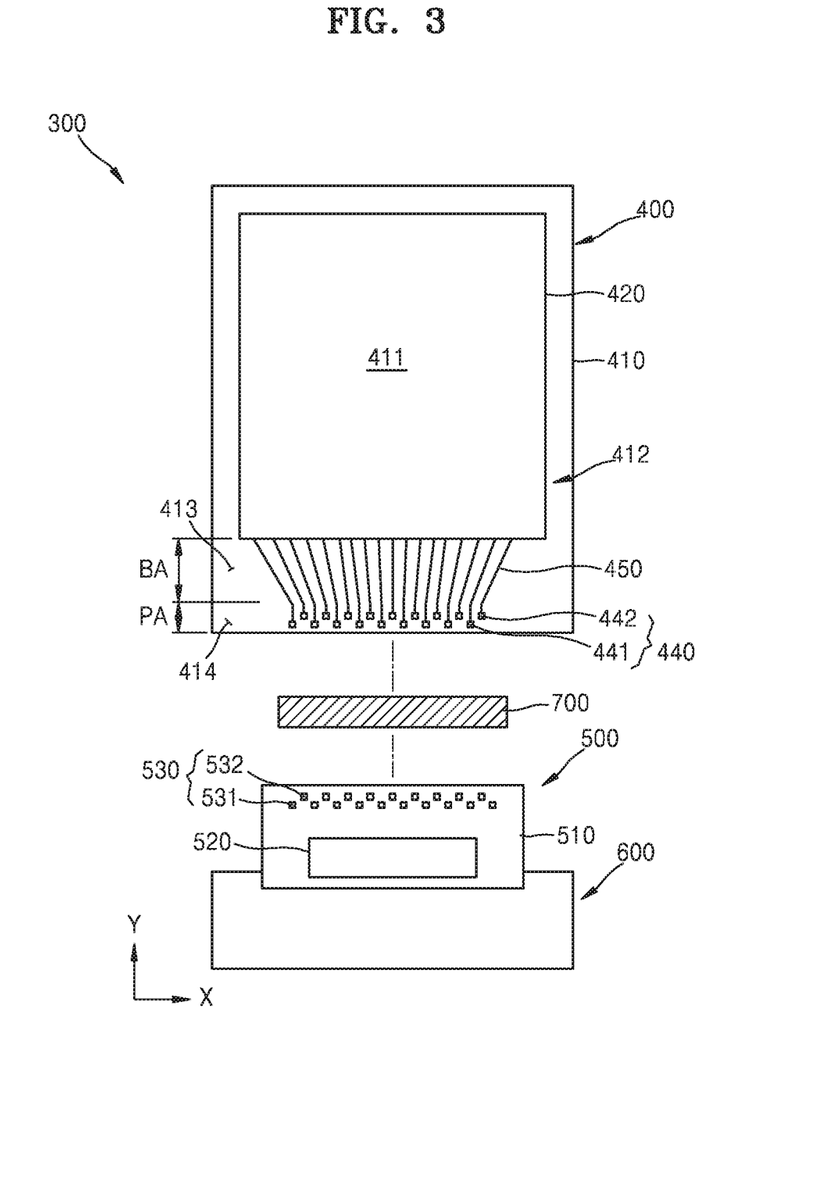
FIG. 3 is a plan view of a flexible display device in a separated state, according to another embodiment.
Figure 4:
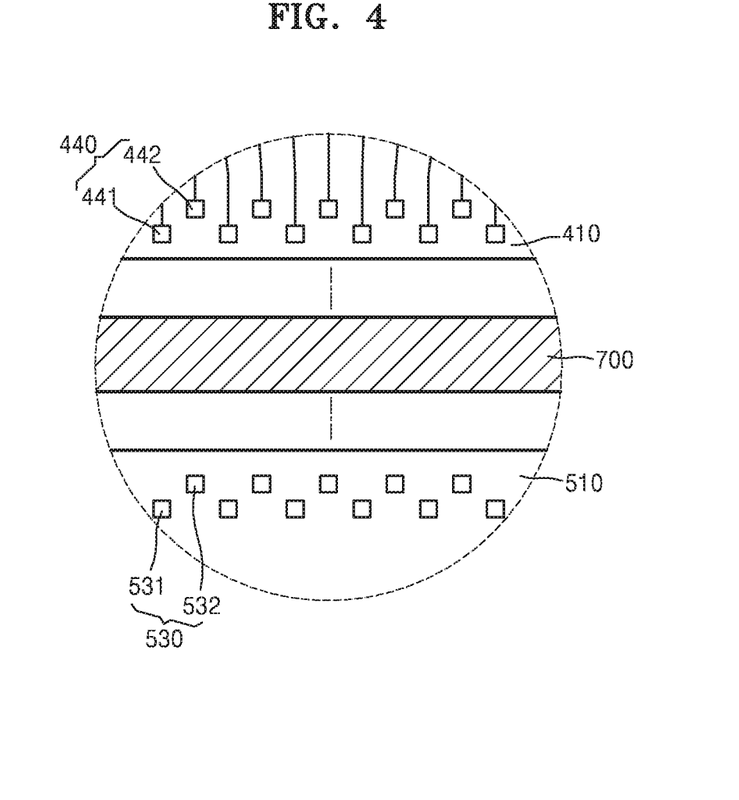
FIG. 4 is an enlarged view of an area where pad terminals and driving terminals of FIG. 3 are located.
Figure 5:
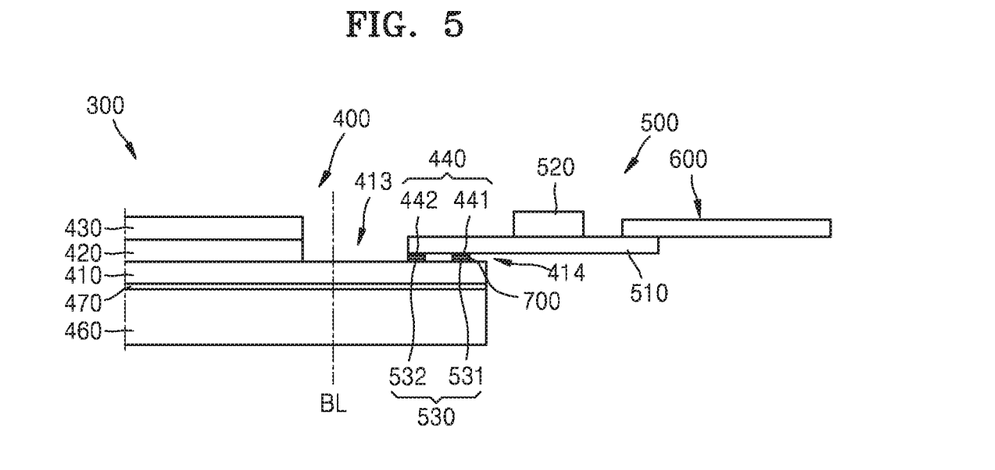
FIG. 5 is a cross-sectional view of the flexible display device of FIG. 3 in a coupled state.

FIG. 3 is a plan view of a flexible display device 300 in a separated state, according to another embodiment. FIG. 4 is an enlarged view of an area where a plurality of pad terminals 440 and a plurality of driving terminals 530 of FIG. 3 are located. FIG. 5 is a cross-sectional view of the flexible display device 300 of FIG. 3 in a coupled state.

Referring to FIGS. 3 to 5, the flexible display device 300 includes a flexible display panel 400, a driver (or display driver) 500 electrically connected to the flexible display panel 400, and a circuit board 600 connected to the driver 500.

According to an embodiment, the flexible display device 300 may include an organic light-emitting diode (OLED) display, but is not limited thereto, and may include other types of display devices such as a liquid crystal display (LCD), a field emission display (FED), or an electronic paper display (EDP).

The flexible display panel 400 may include a display substrate 410 including a plurality of elements and a thin film encapsulation (TFE) layer 420 arranged above the display substrate 410.

At least one thin film transistor (TFT) and at least one emission device connected to the TFT may be provided above the display substrate 410. A functional film 430 such as a polarizing plate may be provided above the TFE layer 420.

The display substrate 410 may include an active area 411 displaying images, and an inactive area 412 extending outside the active area 411.

The active area 411 may be covered by the TFE layer 420.

The inactive area 412 surrounds the active area 411.

The inactive area 412 may include a bending area (BA) 413 that folds in a direction and a pad area (PA) 414 extending outside the bending area 41 when the flexible display panel 400 is folded.

The bending area 413 of the flexible display panel 400 may be folded in a direction with respect to an imaginary bending line BL. The imaginary bending line BL may be located in the bending area 413.

The pad area 414 may be located at a periphery of the display substrate 410. The pad terminals 440 may be located in the pad area 414. The pad terminals 440 may be connected to wires 450 extending from the active area 411.

The pad terminals 440 may be electrically connected to the driving terminals 530 in the driver 500. A conductive unit 700 provided between the pad terminals 440 and the driving terminals 530 may electrically connect the pad terminals 440 to corresponding driving terminals 530. The pad terminals 440 and the driving terminals 530 may perpendicularly face one another with the conductive unit 700 in between.

At least two columns of the pad terminals 440 may be arranged above the display substrate 410. The pad terminals 440 may include a plurality of first pad terminals 441 arranged in a first column in a Y-axis direction of the display substrate 410 and a plurality of second pad terminals 442 arranged in a second column in the Y-axis direction of the display substrate 410. The pad terminals 440 are not limited to a specific structure, and may be arranged in any structure with at least two columns on the display substrate 410.

The first pad terminals 441 and the second pad terminals 442 may be spaced apart in an X-axis direction of the display substrate 410. The first pad terminals 441 and the second pad terminals 442 may be alternately arranged. The first pad terminals 441 and the second pad terminals 442 may be arranged in a zigzag pattern. The arrangement structure of the first pad terminals 441 and the second pad terminals 442 are not limited to one specific example.

The driver 500 may include a driving circuit and a chip on film (COF). The driver 500 may include a flexible film 510, a driving integrated circuit (IC) 520 above the flexible film 510, and the driving terminals 530 arranged at an edge of the flexible film 510. According to an embodiment, the driver 500 has any structure with a plurality of terminals above a flexible film, such as a chip on plastic (COP) or a chip on glass (COG).

The driving terminals 530 may be connected to the pad terminals 440. At least two columns of the driving terminals 530 may be arranged on the flexible film 510. The driving terminals 530 may be arranged correspondingly to the pad terminals 440.

The driving terminals 530 may include a plurality of first driving terminals 531 arranged in a first column in a Y-axis direction of the flexible film 510 and a plurality of second driving terminals 532 arranged in a second column in the Y-axis direction of the flexible film 510. The first driving terminals 531 may be located correspondingly to the first pad terminals 441, and the second driving terminals 532 may be located correspondingly to the second pad terminals 442. The first driving terminals 531 and the second driving terminals 532 may be arranged in a zigzag pattern.

The driver 500 may be electrically connected to the circuit board 600. The circuit board 600 may be a flexible printed circuit board (FPCB).

A back plate 460 may be further located under the display substrate 410. The back plate 460 may be provided to enhance the strength the display substrate 410.

According to an embodiment, the display substrate 410 is formed of a thin insulating material, for example, polyimide (PI). The back plate 460 is formed of an insulating material that is thicker than that of the display substrate 410, for example, polyethylene terephthalate (PET), to maintain smoothness of the display substrate 410.

An attachment layer 470 may be provided between the display substrate 410 and the back plate 460.

The flexible display device 300 may electrically connect the pad terminals 440 to the driving terminals 530 by using a pressing unit.

Figure 6:
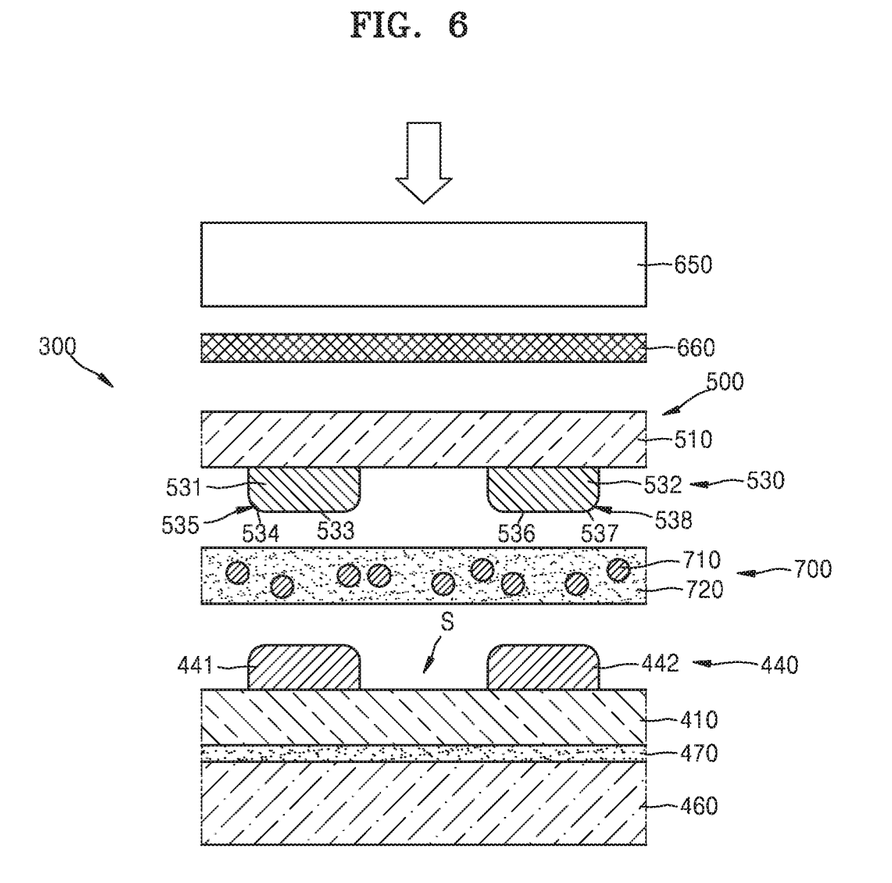
FIG. 6 is an enlarged cross-sectional view of the pad terminals and the driving terminals of FIG. 3 that are separated before being connected to each other.
Figure 7:
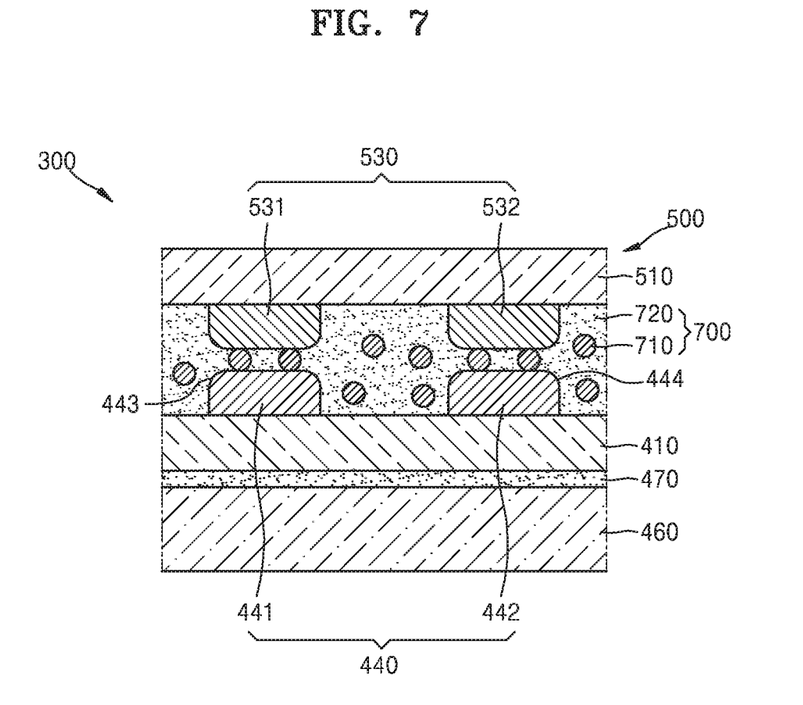
FIG. 7 is an enlarged cross-sectional view of the pad terminals and the driving terminals of FIG. 3 that are connected to each other.

FIG. 6 is an enlarged cross-sectional view of the pad terminals 440 and the driving terminals 530 of FIG. 3 that are separated before being connected to each other. FIG. 7 is an enlarged cross-sectional view of the pad terminals 440 and the driving terminals 530 of FIG. 3 that are connected to each other.

Referring to FIGS. 6 and 7, the display substrate 410 is provided in the flexible display device 300. The back plate 460 may be coupled to a rear surface of the display substrate 410. The pad terminals 440 may be provided above the display substrate 410. The pad terminals 440 include the first and second pad terminals 441 and 442 that are arranged above different columns.

The driver 500 may be arranged above the display substrate 410.

The driving terminals 530 may be provided above the flexible film 510 in the driver 500. The driving terminals 530 may include the first and second driving terminals 531 and 532 that respectively correspond to the first and second pad terminals 441 and 442 in a vertical direction of the flexible display device 300.

The conductive unit 700 provided between the pad terminals 440 and the driving terminals 530 may electrically connect the pad terminals 440 to the driving terminals 530. The conductive unit 700 may be a conductive film. Current may flow in a thickness direction of the conductive film, and the conductive film may be insulated in a width direction or a lengthwise direction. According to an embodiment, the conductive unit 700 is an anisotropic conductive film (ACF).

The conductive unit 700 may include conductive particles 710 that form an electric path between the pad terminals 440 and the driving terminals 530 such as conductive balls, and an insulating resin 720 that fixes the conductive particles 710 in appropriate positions and increase connection reliability.

According to an embodiment, the conductive unit 700 is provided and commonly used in an area where the first pad terminals 441 are connected to the first driving terminals 531 and an area where the second pad terminals 442 are connected to the second driving terminals 532.

According to another embodiment, the conductive unit 700 may be separately provided in the area where the first pad terminals 441 are connected to the first driving terminals 531, and the area where the second pad terminals 442 are connected to the second driving terminals 532.

A header 650 of a pressing device such as a hot bar may be provided above the driver 500. A buffer 660 may be provided between the driver 500 and the header 650. The buffer 660 may prevent impurities, which may be created during a pressing process in an area where the pad terminals 440 are pressed to the driving terminals 530, from moving to the header 650 of the pressing device. The buffer 660 may be formed of an insulating material such as Teflon or silicon.

When the header 650 of the pressing device falls, due to heat and pressure applied to the header 650, the conductive particles 710 may be located between the pad terminals 440 and the driving terminals 530 that respectively correspond to one another. The pad terminals 440 may be electrically connected to the driving terminals 530 via the conductive particles 710.

The insulating resin 720 may be spread outside an area where the pad terminals 440 are connected to the driving terminals 530, and thus insulate a pair of the pad terminals 440 and the driving terminals 530 from another pair of the pad terminals 440 and the driving terminals 530 adjacent to the aforementioned pair.

When the pad terminals 440 are pressed to the driving terminals 530, an area nearby an area where the pad terminals 440 are pressed to the driving terminals 530 may be deformed. For example, the display substrate 410 or the attachment layer 470 that are vulnerable to heat may be deformed by heat applied to the header 650 of the pressing device.

For example, a space S exists between i) a pair of the first pad terminals 441 and the first driving terminals 531 that are arranged in a first column and electrically connected to one another and ii) a pair of the second pad terminals 442 and the second driving terminals 532 that are arranged in a second column and electrically connected to one another. The boundary of the space S may be curved due to heat. For example, the display substrate 410 and the attachment layer 470 may inflate.

When inflated, disconnection such as cracks may appear at edges of the first and second driving terminals 531 and 532.

The driving terminals 530 may have rounding units to prevent cracks. Boundaries of the driving terminals 530 may be curved.

At least one first rounding unit 535 may be at an edge 534 of a first surface 533 of each of the first driving terminals 531 facing the first pad terminals 441. The first rounding unit 535 may round the edge 534 of the first surface 533 of each of the first driving terminals 531.

According to an embodiment, the first driving terminals 531 may have a square shape as shown in FIG. 4. The first rounding unit 535 may be provided along all edges of the first driving terminals 531.

At least one second rounding unit 538 may be at an edge 537 of a first surface 536 of each of the second driving terminals 532 facing the second pad terminals 442. The second rounding unit 538 may round the edge 537 of the first surface 536 of each of the second driving terminals 532. Like the first rounding unit 535, the second rounding unit 538 may also be provided along all edges of the second driving terminals 532.

Since the first and second driving terminals 531 and 532 includes the first and second rounding units 535 and 538, while pressing by using the header 650 of the pressing device, stress due to the pressing may be scattered at the edge 534 of the first driving terminals 531 and the edge 537 of the second driving terminals 532.

Accordingly, the display substrate 410 and the attachment layer 470 may be prevented from being inflated in the space S around the pressed area. As a result, it is possible to prevent disconnection of the first pad terminals 441 and the first driving terminals 531 and disconnection of the second pad terminals 442 and the second driving terminals 532.

A third rounding unit 443 may be provided at a surface of each of the first pad terminals 441 corresponding to the first driving terminals 531, and a fourth rounding unit 444 may be provided at a surface of each of the second pad terminals 442 corresponding to the second driving terminals 532.

Figure 8:
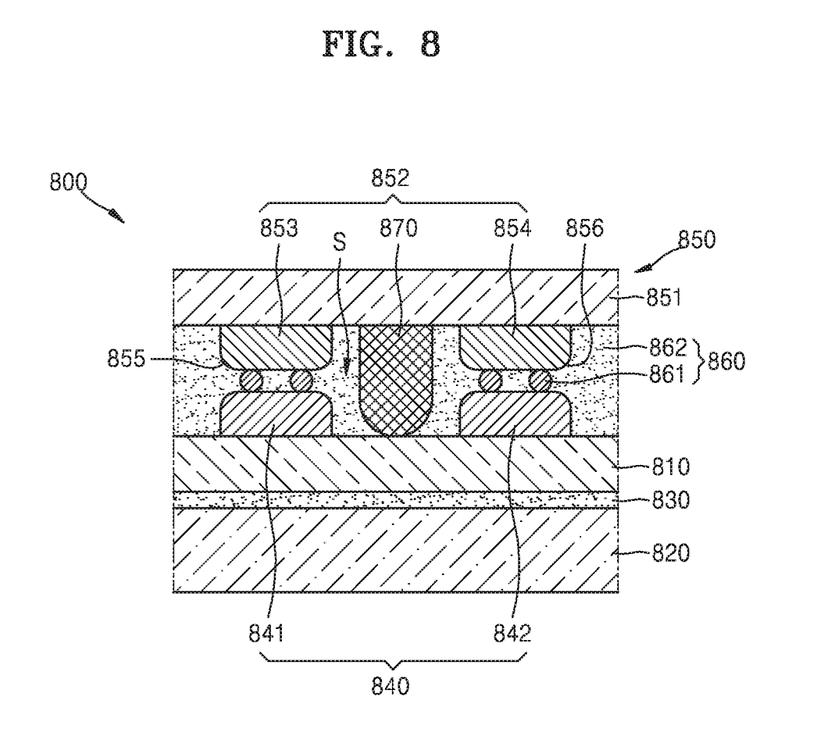
FIG. 8 is an enlarged cross-sectional view of pad terminals connected to driving terminals in a flexible display device, according to another embodiment.

FIG. 8 is an enlarged cross-sectional view of pad terminals connected to driving terminals in a flexible display device 800, according to another embodiment.

Hereinafter, since like elements shown in the aforementioned drawings as well as FIG. 8 have the same functions, main features of each of the embodiments will be mainly described.

Referring to FIG. 8, a display substrate 810 is provided in the flexible display device 800. A back plate 820 may be coupled to a rear surface of the display substrate 810. An attachment layer 830 may be provided between the display substrate 810 and the back plate 820.

A plurality of pad terminals 840 may be provided above the display substrate 810. The pad terminals 840 may include a first pad terminal 841 and a second pad terminal 842 in separate columns.

A driver 850 may be provided above the display substrate 810.

A plurality of driving terminals 852 may be provided on a flexible film 851 in the driver 850. The driving terminals 852 includes a first driving terminal 853 and a second driving terminal 854 that respectively correspond to the first pad terminal 841 and the second pad terminal 842 in a vertical direction of the flexible display device 800. A first rounding unit 855 may be located at an edge of the first driving terminal 853, and a may be located at an edge of the second driving terminal 854.

A conductive unit 860 between the pad terminals 840 and the driving terminals 852 may electrically connect the pad terminals 840 to the driving terminals 852. The conductive unit 860 may include conductive particles 861 and an insulating resin 862.

At least one barrier 870 may be provided between a plurality of first driving terminals 853 on a first column and a plurality of second driving terminals 854 on a second column. The at least one barrier 870 may be provided to prevent the first driving terminals 853 and the second driving terminals 854 located on different columns from being deformed. The at least one barrier 870 may include an insulating material.

The at least one barrier 870 may protrude from a surface of the flexible film 851 facing the pad terminals 840. A height of the at least one barrier 870 may correspond to a distance between the display substrate 810 and the flexible film 851.

While the pad terminals 840 and the driving terminals 852 are pressed to one another, the display substrate 810 and the attachment layer 830 may inflate due to heat applied to a peripheral space S around a pressed area.

The at least one barrier 870 may protrude from a surface of the flexible film 851 corresponding to the peripheral space S. The at least one barrier 870 may apply pressure on the peripheral space S such that the display substrate 810 and the attachment layer 830 do not inflate, and thus prevent disconnection.

The at least one barrier 870 may have various shapes and arranged in various ways.

Figure 9:
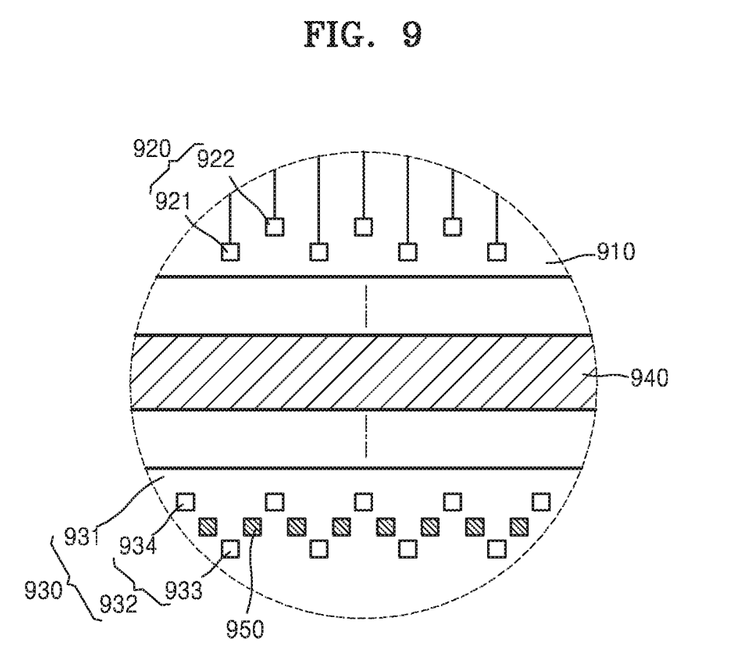
FIGS. 9, 10 and 11 are enlarged plan view of a modified example of the flexible display device FIG. 8.

Referring to FIG. 9, a pad terminal 920 may be provided on a display substrate 910. The pad terminal 920 may include a first pad terminal 921 and a second pad terminal 922 that are arranged in separate columns.

A driver 930 may include a flexible film 931 and a driving terminal 932 above the flexible film 931. The driving terminal 932 may include a first driving terminal 933 connected to the first pad terminal 921 and a second driving terminal 934 connected to the second pad terminal 922.

A conductive unit 940 provided between the pad terminal 920 and the driving terminal 932 may electrically connect the pad terminal 920 and the driving terminal 932.

At least one barrier 950 may be provided between a plurality of first driving terminals 933 on a first column and a plurality of second driving terminals 934 on a second column. The at least one barrier 950 may be provided between each of the first driving terminals 853 and the second driving terminals 854. The at least one barrier 950 may be arranged in a square dot pattern.

According to the present embodiment, the at least one barrier 950 is arranged in a diagonal line between the first driving terminal 933 and the second driving terminal 934, but is not limited thereto. The at least one barrier 950 may be arranged in any manner between the corresponding first driving terminals 933 and the second driving terminals 934.

Figure 10:
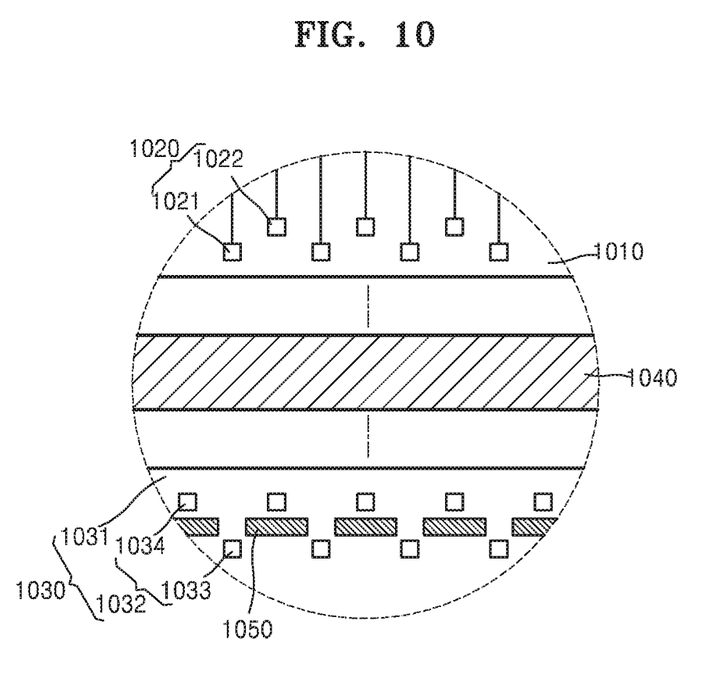

Referring to FIG. 10, a pad terminal 1020 including a first pad terminal 1021 and a second pad terminal 1022 on separate columns may be provided above a display substrate 1010.

A driver 1030 may include a flexible film 1031, and a driving terminal 1032 including a first driving terminal 1033 and a second driving terminal 1034 provided above the flexible film 1031.

A conductive unit 1040 may be provided between the pad terminal 1020 and the driving terminal 1032.

At least one barrier 1050 may be provided between a plurality of first driving terminals 1033 on a first column and a plurality of second driving terminals 1034 on a second column. The at least one barrier 1050 may be provided between a group of the first driving terminals 1033 and a group of the second driving terminals 1034. The at least one barrier 1050 may be arranged in a plurality of strip patterns and spaced apart by certain intervals in a direction.

Figure 11:
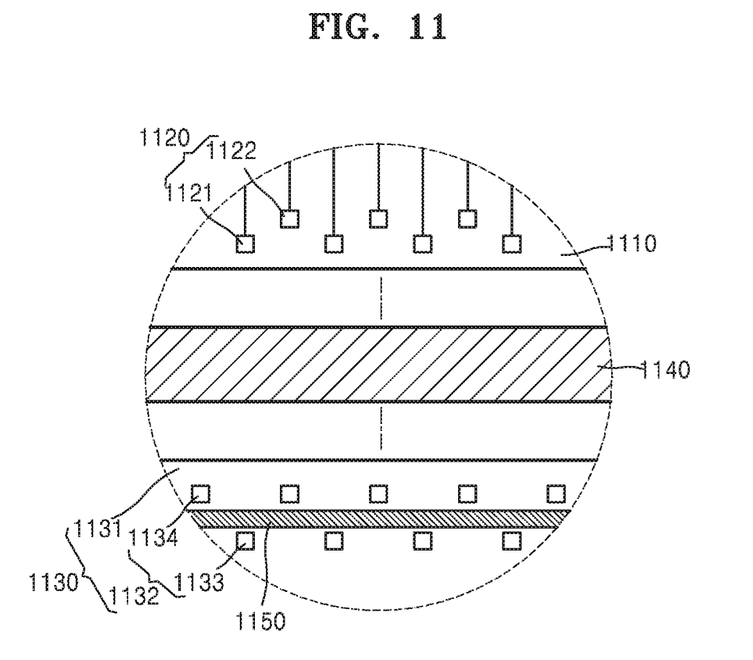

Referring to FIG. 11, a pad terminal 1120 including a first pad terminal 1121 and a second pad terminal 1122 on separate columns may be provided above a display substrate 1110.

A driver 1130 may include a flexible film 1131, and a driving terminal 1132 including a first driving terminal 1133 and a second driving terminal 1134 provided above the flexible film 1131.

A conductive unit 1140 may be provided between the pad terminal 1120 and the driving terminal 1132.

At least one barrier 1150 may be provided between a plurality of first driving terminals 1133 on a first column and a plurality of second driving terminals 1134 on a second column. The at least one barrier 1150 may be formed as a single strip extending between the first driving terminals 1133 and the second driving terminals 1134. The at least one barrier 1050 may extend in a width direction of the flexible film 1131.

Figure 12:
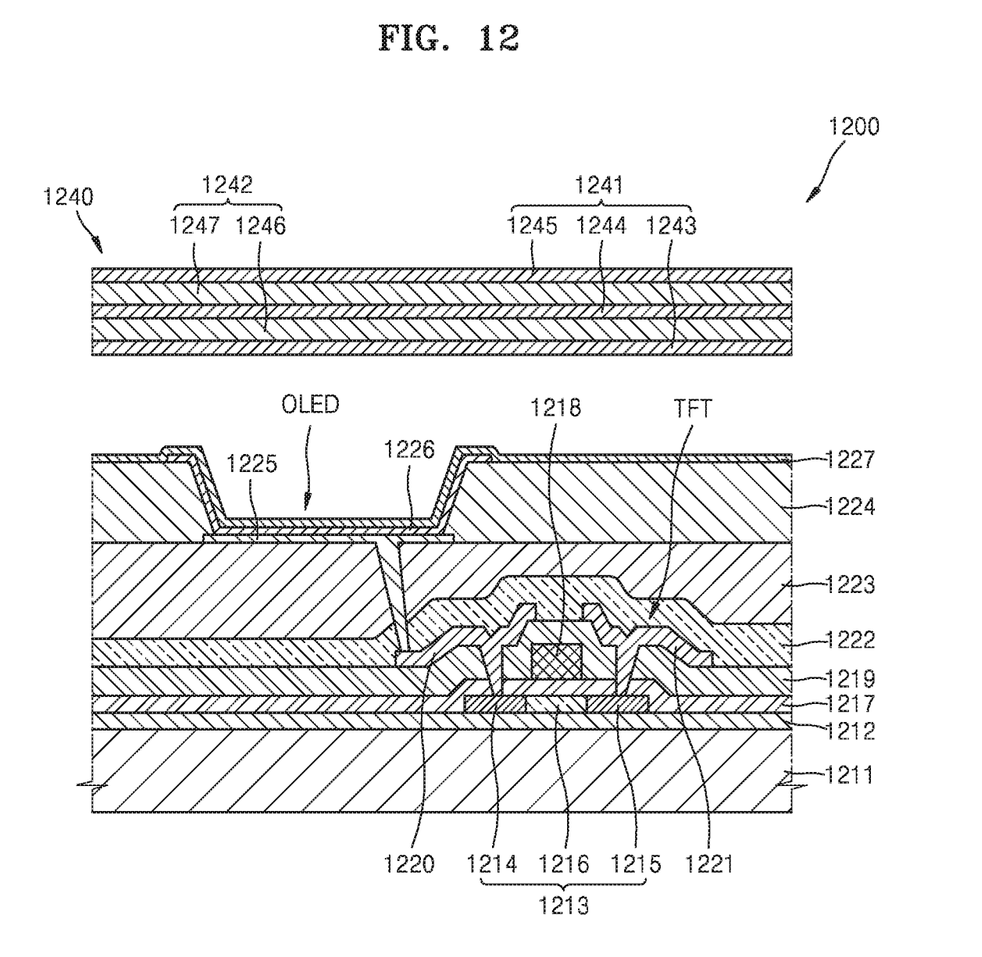
FIG. 12 is a cross-sectional view of a sub-pixel of an OLED display, according to an embodiment.

FIG. 12 is a cross-sectional view of a sub-pixel of an OLED display panel 1200, according to an embodiment.

According to the present embodiment, each of sub-pixels includes at least one thin film transistor TFT and an organic light-emitting device OLED. The thin film transistor TFT is not limited to a structure shown in FIG. 12. The number and the structure of the thin film transistor TFT may be modified in various ways.

Referring to FIG. 12, the OLED display panel 1200 may include a display substrate 1211 and a thin film encapsulation layer 1240 above the display substrate 1211.

The display substrate 1211 may be a flexible glass substrate or a flexible polymer substrate. The display substrate 1211 may be transparent, semi-transparent, or opaque.

A buffer layer 1212 may be provided above the display substrate 1211. The buffer layer 1212 may cover an upper surface of the display substrate 1211. The buffer layer 1212 may be formed as an inorganic layer or an organic layer. The buffer layer 1212 may include a single layer or a plurality of layers.

The thin film transistor TFT may be provided above the buffer layer 1212.

A semiconductor active layer 1213 may be provided above the buffer layer 1212.

The semiconductor active layer 1213 may include a source area 1214 and a drain area 1215 arranged by doping N-type impurity ions or P-type impurity ions. A channel area 1216 may be between the source area 1214 and the drain area 1215 and not doped with impurities. The semiconductor active layer 1213 may include organic semiconductor, inorganic semiconductor, or amorphous silicon. According to another embodiment, the semiconductor active layer 1213 may include oxide semiconductor.

A gate insulating layer 1217 may be deposited above the semiconductor active layer 1213. The gate insulating layer 1217 may include an inorganic layer. The gate insulating layer 1217 may include a single layer or a plurality of layers.

A gate electrode 1218 may be provided above the gate insulating layer 1217. The gate electrode 1218 may include a metallic material with excellent conductivity. The gate electrode 1218 may include a single layer or a plurality of layers.

An interlayer insulating layer 1219 may be arranged above the gate electrode 1218. The interlayer insulating layer 1219 may include an inorganic layer or an organic layer.

A source electrode 1220 and a drain electrode 1221 may be provided above the interlayer insulating layer 1219. In some embodiments, a contact hole is formed by removing a portion of the gate insulating layer 1217 and a portion of the interlayer insulating layer 1219. Then, via the contact hole, the source electrode 1220 may be electrically connected to the source area 1214, and the drain electrode 1221 may be electrically connected to the drain area 1215.

A passivation layer 1222 may be provided above the source electrode 1220 and the drain electrode 1221. The passivation layer 1222 may include an inorganic layer or an organic layer. A planarization layer 1223 may be provided above the passivation layer 1222. The planarization layer 1223 may include an organic layer. Any one of the passivation layer 1222 and the planarization layer 1223 may be omitted.

The thin film transistor TFT may be electrically connected to the organic light-emitting device OLED.

The OLED may be provided above the planarization layer 1223. The organic light-emitting device OLED may include a first electrode 1225, an intermediate layer 1226, and a second electrode 1227.

The first electrode 1225 may function as an anode and include various conductive materials. The first electrode 1225 may include a transparent electrode or a reflective electrode. The first electrode 1225 may include a transparent conductive film such as indium tin oxide (ITO), indium zinc oxide (IZO), ZnO, and $In_2O_3$, or the like, or a metallic film including one selected from silver (Ag), magnesium (Mg), aluminum (Al), platinum (Pt), palladium (Pd), gold (Au), nickel (Ni), neodymium (Nd), iradium (Ir), chrome (Cr), and a compound thereof.

A pixel defining layer 1224 may be provided above the planarization layer 1223. The pixel defining layer 1224 may cover a portion of the first electrode 1225. In some embodiments, the pixel defining layer 1224 defines an emission area of each of the sub-pixels by surrounding edges of the first electrode 1225. The first electrode 1225 may be patterned in each of the sub-pixels.

The pixel defining layer 1224 may include an organic layer or an inorganic layer. The pixel defining layer 1224 may include a single layer or a plurality of layers.

Above the first electrode 1225, the intermediate layer 1226 may be located at an area exposed by etching a portion of the pixel defining layer 1224. The intermediate layer 1226 may be formed by deposition.

The intermediate layer 1226 may include an organic emission layer.

According to another example, the intermediate layer 1226 may include an organic emission layer, and at least one of a hole injection layer (HIL), a hole transport layer (HTL), an electron transport layer (ETL), and an electron injection layer (EIL).

According to an embodiment, the intermediate layer 1226 may include an organic emission layer and other layers with various functions.

The second electrode 1227 may be provided above the intermediate layer 1226.

The second electrode 1227 may function as a cathode. The second electrode 1227 may include a transparent electrode or a reflective electrode. The second electrode 1227 include a transparent conductive film such as ITO, IZO, ZnO, $In_2O_3$, or the like, or a metallic film including one selected from metals with low work function, i.e., lithium (Li), calcium (Ca), LiF/Ca, LiF/Al, Al, Mg, and a compound thereof.

According to an embodiment, a plurality of sub-pixels may be formed above the display substrate 1211. For example, each of the sub-pixels may emit red, green, blue, or white light, but is not limited thereto.

The thin film encapsulation layer 1240 may cover the organic light-emitting device OLED.

In the thin film encapsulation layer 1240, an inorganic layer 1241 and an organic layer 1242 may be alternately stacked. For example, the inorganic layer 1241 may include a first inorganic layer 1243, a second inorganic layer 1244, and a third inorganic layer 1245. The organic layer 1242 may include a first organic layer 1246 and a second organic layer 1247.

According to at least one of the disclosed embodiments, a flexible display device have round driving terminals of a driver, and thus electric connection between the driving terminals and pad terminals may be more reliable.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A flexible display device comprising:
    a flexible display panel including a display substrate, wherein the display substrate includes an active area for pixel circuits, an inactive area adjacent to the active area and having a pad area including a plurality of pad terminals, and a thin film encapsulation layer covering the active area;
    a display driver electrically connected to the pad terminals and comprising a plurality of driving terminals; and
    a conductive unit configured to electrically connect the pad terminals to the respective driving terminals, the conductive unit including an anisotropic conductive film,
    wherein the plurality of the pad terminals respectively include at least one rounded outer edge along a direction facing the driving terminals.

2. The flexible display device of claim 1, wherein the plurality of driving terminals respectively include at least one rounded outer edge along a direction facing the pad terminals.

3. The flexible display device of claim 2, wherein the display driver comprises a flexible film, wherein at least one of the driving terminals is located at an edge of the flexible film.

4. The flexible display device of claim 3, wherein the driving terminals and the pad terminals respectively face one another with the conductive unit provided therebetween.

5. The flexible display device of claim 4, wherein each of the driving terminals has an edge that corresponds to an edge of the respective pad terminal.

6. The flexible display device of claim 4, wherein the pad terminals are arranged in at least two columns over the display substrate, and wherein the driving terminals are arranged in at least two columns over the flexible film.

7. The flexible display device of claim 6, wherein the pad terminals comprise a plurality of first pad terminals on a first column and a plurality of second pad terminals on a second column adjacent to the first pad terminals, and wherein the driving terminals comprise a plurality of first driving terminals overlapping the first pad terminals and a plurality of second driving terminals overlapping the second pad terminals in the depth dimension of the flexible display device.

8. The flexible display device of claim 6, further comprising at least one barrier provided between a plurality of first ones of the driving terminals on a first column and a plurality of second ones of the driving terminals on a second column.

9. The flexible display device of claim 8, wherein the at least one barrier protrudes from a surface of the flexible film facing the pad terminals.

10. The flexible display device of claim 9, wherein the barrier has a height that is the same as the distance between the display substrate and the flexible film.

11. The flexible display device of claim 8, wherein the at least one barrier includes a dot pattern between the first driving terminals and the second driving terminals.

12. The flexible display device of claim 10, wherein the at least one barrier includes at least one strip between a group of the first driving terminals and a group of the second driving terminals.

13. The flexible display device of claim 12, wherein the at least one barrier extends in the form of a single strip between the first and second driving terminals.

14. The flexible display device of claim 8, wherein the at least one barrier is formed of an insulating material.

15. The flexible display device of claim 7, wherein the first pad terminals and the second pad terminals are alternately arranged, and wherein the first and second driving terminals respectively overlap the first pad terminals and the second pad terminals in the depth dimension of the flexible display device.

16. The flexible display device of claim 3, wherein the display driver comprises a chip on film.

17. The flexible display device of claim 2, wherein the conductive unit comprises:
    a plurality of conductive particles configured to form an electric path between the pad terminals and the driving terminals; and
    an insulating resin surrounding the conductive particles.

18. The flexible display device of claim 2, further comprising a back plate provided under the display substrate.

19. The flexible display device of claim 1, wherein the at least one rounded outer edge is at all sides of the pad terminal.

* * * * *